United States Patent [19]

Copeland

[11] Patent Number: 4,577,207
[45] Date of Patent: Mar. 18, 1986

[54] DUAL WAVELENGTH OPTICAL SOURCE
[75] Inventor: John A. Copeland, Dunwoody, Ga.
[73] Assignee: AT&T Bell Laboratories, Murray Hill, N.J.
[21] Appl. No.: 454,550
[22] Filed: Dec. 30, 1982
[51] Int. Cl.$^4$ .............................................. H01L 33/00
[52] U.S. Cl. ......................................... 357/17; 372/50
[58] Field of Search ..................... 357/17, 19; 372/23, 372/50

[56] References Cited

U.S. PATENT DOCUMENTS

| | | | |
|---|---|---|---|
| 3,891,993 | 6/1975 | Beneking | 357/19 |
| 4,176,367 | 11/1979 | Uematsu | 357/17 |
| 4,179,702 | 12/1979 | Lamorte | 357/19 |

FOREIGN PATENT DOCUMENTS 0190392  11/1982  Japan ..................................... 372/45

OTHER PUBLICATIONS

John C. Bean, "Silicon Molecular Beam Epitaxy as a VLSI Processing", *International Electron Devices Meeting* 1981, Washington, D. C. Dec. 7-8-9, pp. 6-13.
*Electronics Letters*, vol. 16, No. 22, pp. 845-846, T. P. Lee et al., "Dual Wavelength Surface Emitting InGaAsP L.E.D.S," Oct. 1980.
*Optoelectronics Designer's Catalog* 1982, Hewlett Packard, pp. 16-21.
John A. Copeland et al., "p-n-p-n Detectors and Light-Emitting Diodes", *IEEE Jour. of Quantum Electronics*, V. OE-14, No. 11, Nov. 1978, pp. 810-813.
"Small-Area, High-Radiance C.W. InGaAsP L.E.D.S Emitting at 1.3 μm", Dentai et al., *Electronics Letters*, pp. 484-485, Aug. 4, 1977.

Primary Examiner—James W. Davie
Assistant Examiner—Georgia Y. Epps
Attorney, Agent, or Firm—Richard B. Havill

[57] ABSTRACT

A dual wavelength optical source includes a monolithic integrated pair of series-opposition connected diodes, each fabricated for emitting light having a different wavelength than the other. Polarity of a common bias current conducted through the diodes is reversed for activating alternatively light emission from the diodes. Active emission regions of the diodes are stacked upon one another for efficiently coupling the resulting beams of the different wavelengths of emitted light through a surface into the core of a single mode optical fiber.

3 Claims, 4 Drawing Figures

DUAL WAVELENGTH OPTICAL SOURCE

The invention relates to an optical source which may be more particularly described as a dual wavelength optical source for time division multiplexing different wavelength light signals into a single mode fiber.

BACKGROUND OF THE INVENTION

Optical fiber transmission systems provide a large capacity for transmitting information. Commercial optical fiber systems for telephony and data transmission were first put into use within the past few years. In spite of their recent introduction into commercial use, it is foreseeable that improved optical transmission systems will be needed. Although the transmission capacity in present systems is very high, projections show a need for even higher capacity systems in the future.

Recently dual wavelength optical sources have been discovered for wavelength multiplexing different wavelength signals onto optical fibers. This discovery occurred since methods were developed for fabricating optical fibers with very low losses across a wide range of wavelengths from 0.8 to 1.6 micrometers.

Dual wavelength optical sources are made as lasers and as light emitting diodes. Prior art optical sources are fabricated in geometric configurations which physically separate the two different light-emitting regions by tens of micrometers. The resulting beams are separated by as much as or more than the tens of micrometers.

Single mode optical fibers provide a desirable optical transmission media. The center core of a single mode optical fiber generally has a diameter of ten micrometers or less.

A problem arises when prior art dual wavelength optical sources are to be multiplexed into a single mode optical fiber. The different wavelength beams of light are separated by more than the ten micrometer diameter of the single mode optical fiber core. Therefore efficient coupling of the two different wavelength beams of light into the fiber core is difficult if not impossible.

SUMMARY OF THE INVENTION

This problem is solved by a dual wavelength optical source including a monolithic integrated pair of series-opposition connected diodes, each fabricated for emitting light having a different wavelength than the other. Polarity of a common bias current conducted through the diodes is reversed for activating alternative light emission from the diodes.

Active emission regions of the diodes are stacked upon one another for efficiently coupling the resulting beams of the different wavelengths of emitted light through a surface into the core of a single mode optical fiber.

BRIEF DESCRIPTION OF THE DRAWING

A better understanding of the invention may be derived by reading the following detailed description with reference to the drawings wherein.

DETAILED DESCRIPTION

Figure 1:
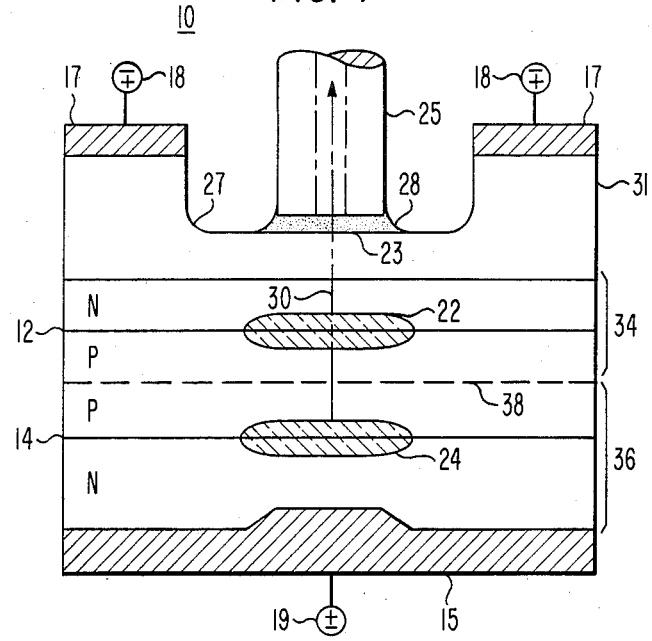
FIG. 1 is a cross-sectional view of a pair of diodes fabricated as a dual wavelength optical source.

Referring now to FIG. 1, there is shown an optical source 10 including a monolithic integrated pair of series-connected back-to-back semiconductor junction diodes 12 and 14. In accordance with further description to be given subsequently, the junction diodes 12 and 14 are fabricated for emitting light having wavelengths different from one another.

Between metallic terminals 15 and 17 there is a common current path through the diodes 12 and 14. Each diode emits light when a forward current is conducted through its junction. Active regions of light emission for the diodes 12 and 14 are shown as elliptical areas 22 and 24, which are centered in each of the junction diodes. Most of the common current occurs through those regions. Light is emitted normal to the planes of the junctions through the upper surface 23 of an etched well 27 of the source 10.

Because the diodes are in series-opposition, the common current conducted therethrough will activate light emission from only one of the diodes at a time. Alternatively, polarity of the common current is reversed to activate light emission from the other diode. To indicate the alternative polarity, both polarities are shown for the top and bottom sources 18 and 19.

A single mode optical fiber end 25 is inserted into the etched well 27 so that the end of the fiber is positioned adjacent to the surface 23. The end of the fiber is affixed to the surface 23 with an index matching epoxy 28 for enabling efficient optical coupling from the diodes 12 and 14 through the surface 23 and the epoxy 28 into the center core of the fiber 25, as shown by the dotted line arrow 30. Because both of the active regions of light emission of the diodes 12 and 14 are located centrally between the sides of the source 10, their emitted light is coupled efficiently along the same center axis normal to the planes of the junctions and the surface 23 of the source 10 into the end of the core of the single mode fiber 25.

Although there are well known methods for fabricating monolithic semiconductor integrated circuits, such as presented in *IEEE Journal of Quantum Electronics,* Vol. QE-14, No. 11, November 1978, pages 810–813 and *Electronics Letters,* Aug. 4, 1977, pages 484–485, incorporated herein by way of reference, some specific information relating to the fabrication of the illustrative embodiment is presented here for fully describing the device.

The dual wavelength source 10 is fabricated to include four epitaxial layers grown by a liquid-phase epitaxy process. Briefly the substrate 31 is a heavily sulphur-doped, low dislocation <100> InP substrate. Active layers of InGaAsP are grown on the substrate. A first homojunction 34 is formed in $In_{0.77}Ga_{0.23}As_{0.50}P_{0.50}$ by doping it with n and p type impurities. The energy band gap of the first homojunction is 1.09 eV, corresponding to an emission wavelength $\lambda 1$ of 1.14 micrometers. A second homojunction 36 is formed by doping $In_{0.67}Ga_{0.33}As_{0.73}P_{0.27}$ with p and n type impurities. The energy band gap of the second homojunction is 0.95 eV, corresponding to an emission wavelength $\lambda 2$ of 1.3 micrometers. This light of the longer wavelength $\lambda 2$, emitted by the diode 14, is transmitted readily through the higher energy gap material of the junction diode 12.

The first and second homojunctions include the light emitting regions 22 and 24 of the diodes 12 and 14, which are arranged electrically in a series circuit with opposed polarities. Anodes, or p doped zones, of the two junctions abut one another along the dotted line 38 in the structure of the source 10.

Figure 2:
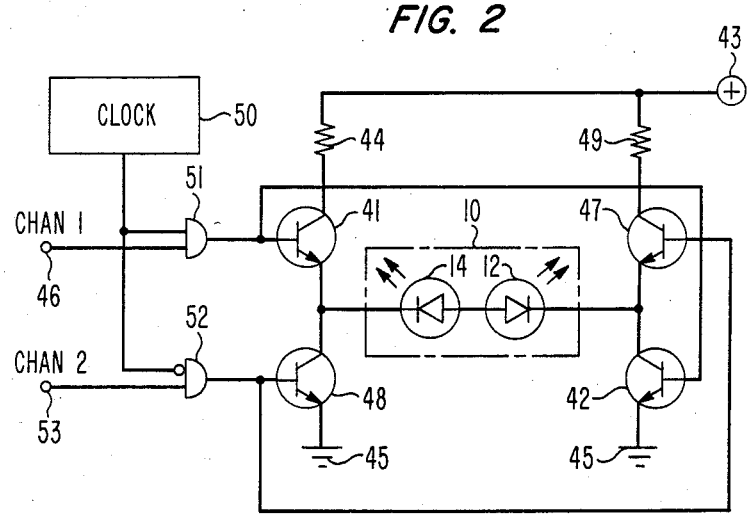
FIG. 2 is a schematic diagram of the pair of diodes of FIG. 1 arranged in a polarity reversing bias circuit.
Figure 3:
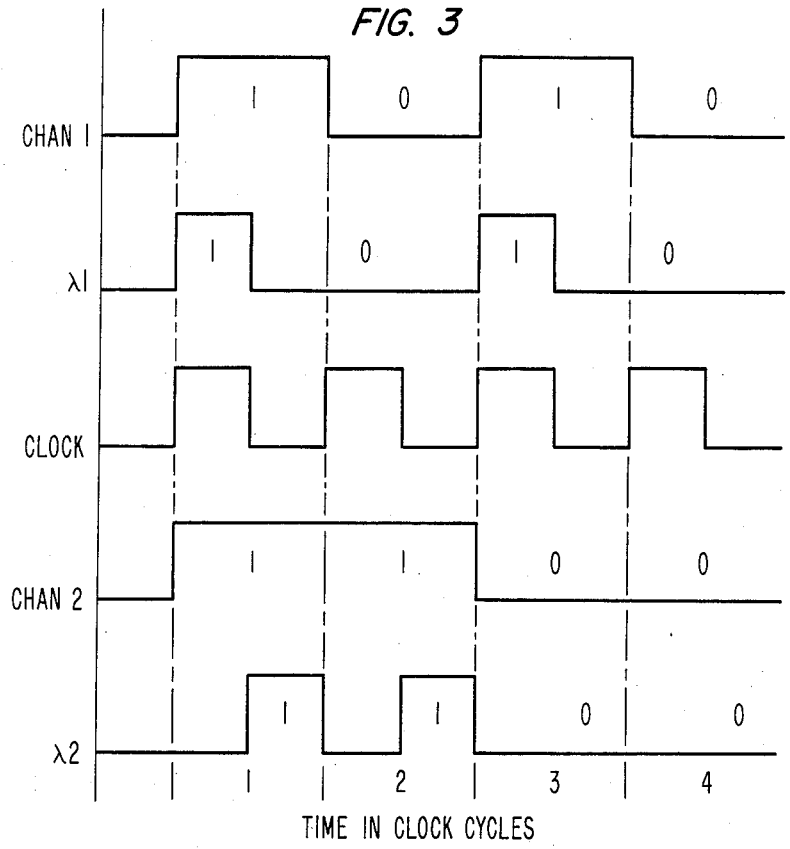
FIG. 3 is a group of waveforms showing signals being multiplexed onto an optical fiber by the circuit of FIG. 2.

Referring now to FIGS. 2 and 3, there is shown in FIG. 2 an optical source 10 including the pair of series-connected back-to-back diodes 12 and 14 arranged in a biasing circuit that operates in accordance with the waveforms of FIG. 3. The diodes 12 and 14 are activated or not during each half of a cycle of a clock 50. Transistors 41 and 42 are interconnected with the optical source 10 to conduct current from a potential source 43 through a resistor 44, the transistor 41, the diodes 14 and 12, and the transistor 42 to ground 45 when a high signal from channel 1 is applied to a terminal 46 during the first half of the first clock cycle while the clock signal is high enabling an AND gate 51. With the high signal from clock 50 disabling an AND gate 52 which receives signals from channel 2 by way of a terminal 53, the transistors 47 and 48 are cut off. Current conducted through the transistors 41 and 42 is conducted from left to right through the diodes 14 and 12 of the source 10. Diode 12 conducts forward current and emits light of the wavelength λ1. Diode 14 is reverse biased and dark. Referring for the moment to FIG. 1, the emitted light emerges from the region 22 and is transmitted along the dotted arrow 30 through the surface 23 into the core of the fiber end 25.

During the second half of the first clock cycle, the clock signal is low disabling the AND gate 51 which receives channel 1. The transistors 41 and 42 are cut off thereby and in turn cut off the left to right bias current through the light source 10. Concurrently, the AND gate 52 receiving channel 2 is enabled by the second half of the clock signal. As a result the transistors 47 and 48 conduct bias current from the potential source 43 through a resistor 49, the transistor 47, the diodes 12 and 14 and the transistor 48 to the ground 45. Diode 14 conducts forward current and emits light of the wavelength λ2. Diode 12 is reverse biased and is dark. Referring briefly again to FIG. 1, the light emitted from region 24 is transmitted along the dotted arrow 30 through the region 22 and the surface 23 also into the core of the fiber end 25.

As a result of this arrangement for reversing the polarity of the common bias current conducted through the diodes 12 and 14 of the source 10, light emission is activated alternatively from the two diodes 12 and 14. During each clock cycle, they are each activated or not in accordance with input signals received from channels 1 and 2, as shown in FIG. 3. The diodes are protected from avalanche breakdown by the current limiting resistors 44 and 49.

Figure 4:
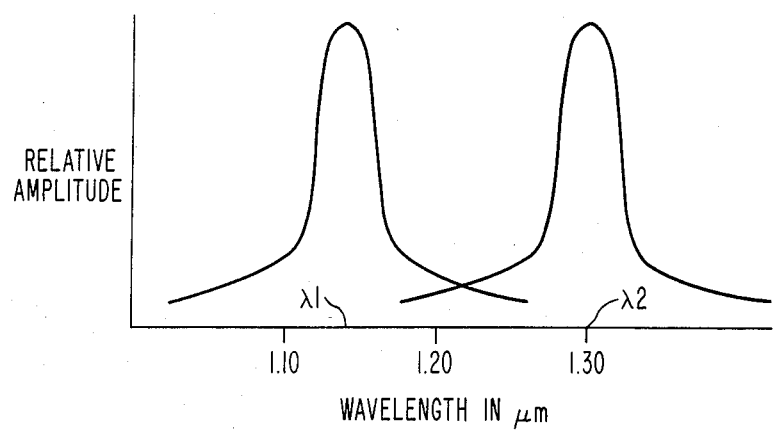
FIG. 4 shows a spectral output of a pair of diodes fabricated in accordance with FIG. 1 and operated in a circuit in accordance with FIG. 2.

Referring now to FIG. 4, there is shown superimposed on a common coordinate the output spectra of the diodes 12 and 14 of the source 10 of FIG. 1. The spectrum having its peak at the wavelength 1.14 micrometers is produced by the large energy band gap diode 12 in FIG. 1. The spectrum having its peak at the wavelength 1.30 micrometers is produced by the small energy band gap diode 14.

The different wavelengths of light emitted by the two diodes 12 and 14 enable a time division multiplexed transmission system to be operated very fast. With two channels applying pulses to the bias circuit every clock cycle, the diodes produce different wavelength optical pulses, as shown in FIG. 3. A pulse of each wavelength can be applied to the fiber as rapidly as the pulse spreading limit of the fiber allows. This arrangement of the source 10 increases the pulse rate in the fiber over the pulse rate of a single wavelength source.

An illustrative embodiment of the invention has been described. Other embodiments will be obvious to those skilled in the art. The described embodiment together with those additional embodiments are considered to be within the scope of the invention.

What is claimed is:

1. A dual wavelength optical source comprising
a monolithic integrated pair of series-opposition connected diodes including
a first diode formed in a first homogeneous material having a first energy band gap and being doped with n and p type impurities as a homojunction for producing light at a first wavelength,
a second diode formed adjacent to the first diode in a second homogeneous material having a second energy band gap and being doped with p and n type impurities as another homojunction for producing light at a second wavelength, and
means interconnected with the first and second diodes for reversing polarity of a common bias current conducted through the first and second diodes and thereby alternatively activating light emission of the first and second wavelengths, respectively, from the first and second diodes along a common path out of the diodes.

2. A dual wavelength optical source in accordance with claim 1 wherein
the first homogeneous material is $In_{0.77}Ga_{0.23}As_{0.50}P_{0.50}$, the first wavelength being approximately 1.14 micrometers, and
the second homogeneous material is $In_{0.67}Ga_{0.33}As_{0.73}P_{0.27}$, the second wavelength being approximately 1.30 micrometers.

3. A dual wavelength optical source comprising
a monolithic integrated pair of series opposition connected diodes including
a first diode formed in a first homogeneous material having a first bandgap, said first diode being a homojunction between p and n regions doped into the first material,
a second diode formed in a second homogeneous material having a second bandgap, said second diode being a homojunction between n and p regions doped into the second material and disposed adjacent to the first diode, and
means, interconnected to nonadjacent like conductivity regions of the first and second diodes, for reversing polarity of a common bias current conducted through the first and second diodes and thereby alternatively activating light emission of first and second wavelengths, respectively, from the first and second diodes along a common path out of the diodes.

* * * * *